United States Patent
Asao et al.

(10) Patent No.: US 6,900,490 B2
(45) Date of Patent: May 31, 2005

(54) MAGNETIC RANDOM ACCESS MEMORY

(75) Inventors: Yoshiaki Asao, Sagamihara (JP);
Hiroaki Yoda, Kawasaki (JP); Minoru Amano, Sagamihara (JP); Tomomasa Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 10/649,986

(22) Filed: Aug. 28, 2003

(65) Prior Publication Data

US 2004/0188733 A1 Sep. 30, 2004

(30) Foreign Application Priority Data

Mar. 27, 2003 (JP) ........................................ 2003-088413

(51) Int. Cl.[7] .............................................. H01L 29/76
(52) U.S. Cl. .................. 257/295; 257/295; 257/421; 257/424; 257/427; 365/158; 365/171; 365/173
(58) Field of Search ................................ 257/295, 421, 257/424, 427; 365/158, 171, 173

(56) References Cited

U.S. PATENT DOCUMENTS

| 5,734,605 | A | 3/1998 | Zhu et al. |
| 5,768,183 | A | 6/1998 | Zhu et al. |
| 6,794,696 | B2 * | 9/2004 | Fukuzumi .................... 257/295 |

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

In a magnetic random access memory for generating an inductive magnetic flux by passing current into write wirings disposed closely to MTJ elements, whose resistance values varying depending on the magnetization array state of two magnetic layers of MTJ elements including two magnetic layers that hold a non-magnetic layer correspond to the stored information of "0"/"1", and writing information by varying the magnetization direction of a free layer of the MTJ elements, the shape of the MTJ elements is warped so as to coincide substantially with the magnetic field curve generated from the write wirings.

12 Claims, 13 Drawing Sheets

TO FIRST MRAM DATA REWRITE CONTROLLER

MAGNETIC RANDOM ACCESS MEMORY

CROSS-REFERENCE TO RELATED APPLICATIONS

This application is based upon and claims the benefit of priority from the prior Japanese Patent Application No. 2003-088413, filed Mar. 27, 2003, the entire contents of which are incorporated herein by reference.

BACKGROUND OF THE INVENTION

1. Field of the Invention

The present invention relates to a magnetic random access memory (MRAM), and more particularly to a structure of a magnetic memory cell composed by using elements capable of storing information of "1"/"0" by the so-called tunneling magneto-resistive effect.

2. Description of the Related Art

Recently, various memories for storing information by a new principle have been proposed. One of them is MRAM in which magnetic memory cells composed of magnetic tunnel junction (MTJ) elements for storing information of "1"/"0" by making use of the tunneling magneto-resistive effect (hereinafter referred to as TMR effect) are arrayed in a matrix. Examples of MRAM are disposed in U.S. Pat. No. 5,734,605 by Zhu et al. and also in U.S. Pat. No. 5,768,183 by Zhu et al.

In the MRAM, plural bit lines for writing/reading and plural write word lines are disposed in the orthogonal direction, and MTJ elements are disposed corresponding to each intersection. Each MTJ element is provided with a spin direction such that the long-side of rectangle is set along the write word line and that the short-side is set along the bit line, and along the long-side direction.

Each bit line is connected to each fixed layer of plural MTJ elements of the same row or same column, and each write word line is disposed so as to face closely to each free layer of plural MTJ elements of the same column or same row.

Writing to the MTJ element is achieved by passing current in the write word lines and bit lines and turning the spin direction of the MTJ element in parallel or anti-parallel direction by using the magnetic field generated by the current flowing in both wirings.

The distance between the write word line and the MTJ element must be longer than the distance between the bit line and the MTJ element, and more current must flow in the write word lines. The magnetic field generated from the write word lines distributes along a loop-shaped curve. Hitherto, since the magnetic field intensity applied in the central portion and in the end portion of the free layer of the MTJ element is different, the writing current increases due to an inverting magnetic field, which has been a problem for practical use.

BRIEF SUMMARY OF THE INVENTION

According to an aspect of the present invention, there is provided a magnetic random access memory including: a first wiring and a second wiring disposed so as to intersect each other; a magnetic tunnel junction element having the tunneling magneto-resistive effect and disposed at the intersection of the first and second wirings, the magnetic tunnel junction element having a structure in which a non-magnetic layer is sandwiched between a fixed layer and a free layer both made of a magnetic film, having a long-side and a short-side of a rectangle, being provided with a spin direction such that the long-side of rectangle is set along the second wiring and that the short-side thereof is set along the first wiring, and along the long-side direction, and having an upper surface which is upwardly convex in the central portion as viewed in the short-side direction, with the long axis as a center of convexity, and a lower surface which is downwardly concave in the central portion as viewed in the short-side direction, with the long axis as a center of concavity; a conductive hard mask formed to cover the upper surface of the magnetic tunnel junction element; conductive contact plugs for electrically connecting the hard mask and the first wiring; a connection wiring to be electrically connected to the lower surface of the magnetic tunnel junction element; and an interlayer insulating film provided to be interposed between the connection wiring and the second wiring.

DETAILED DESCRIPTION OF THE INVENTION

Figure 1:
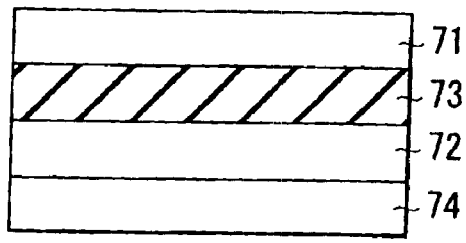
FIG. 1 is a sectional view showing an outline of a structure of an MTJ element for use in MRAM.

Referring now to the drawings, preferred embodiments of the invention will be described in detail below.

FIG. 1 is an outline view of a sectional structure of an MTJ element for use in MRAM.

The MTJ element has a structure in which one non-magnetic layer (tunnel barrier layer) 73 is sandwiched between two magnetic layers 71, 72 made of a ferromagnetic layer or ferromagnetic film. The MTJ element having such structure stores information of "1"/"0" depending on whether the spin direction of the two magnetic layers 71, 72 is parallel or anti-parallel.

Usually, an anti-ferromagnetic layer 74 is disposed at one side of the two magnetic layers 71, 72. In FIG. 1, the anti-ferromagnetic layer 74 is disposed at the side of the magnetic layer 72. The anti-ferromagnetic layer 74 is a member for easily rewriting the information by fixing the spin direction of the one magnetic layer 72, and varying the spin direction of the other magnetic layer 71 only. Herein, the magnetic layer 71 on the spin variable side is called a free layer or recording layer, and the magnetic layer 72 on the spin fixed side is called a fixed layer or spin layer.

Figure 2A:
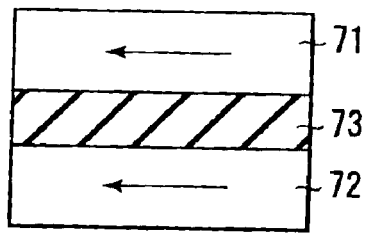
FIGS. 2A and 2B are views showing a spin direction of two magnetic layers of the MTJ element in FIG. 1.
Figure 2B:
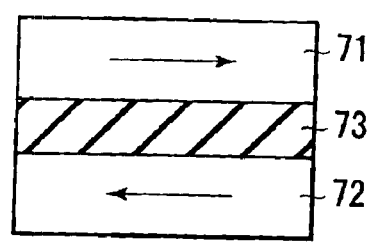

FIGS. 2A and 2B show the spin direction of the two magnetic layers 71,72 of the MTJ element shown in FIG. 1.

As shown in FIG. 2A, the two magnetic layers 71, 72 are same in the spin direction, that is, the arrow direction in the drawing. In the case of the parallel direction, the tunnel resistance of the insulating layer 73 sandwiched between the two magnetic layers 71, 72 becomes the lowest, that is, the tunnel current is the largest.

As shown in FIG. 2B, when the spin directions of the two magnetic layers 71, 72 are anti-parallel, the tunnel resistance of the insulating layer 73 sandwiched between the two magnetic layers 71, 72 becomes the highest, that is, the tunnel current is the smallest.

In the MRAM, two states different in resistance value of the MTJ element correspond to the storage state of information "1" (state 1) and the storage state of information "0" (state 0).

Figure 3:
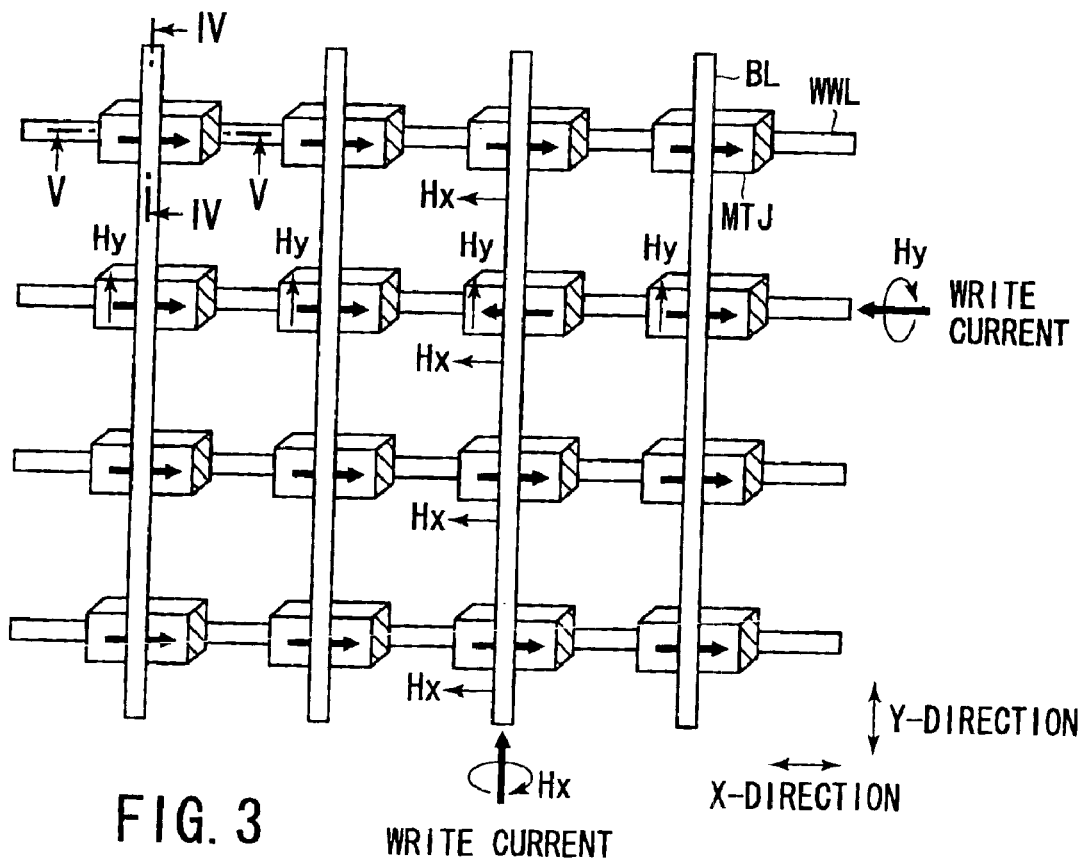
FIG. 3 is a diagram schematically showing an example of layout of cell arrays of the MRAM.

FIG. 3 schematically shows an example of plane layout of part of cell arrays of MRAM.

Plural bit lines BL for writing/reading, and plural write word lines WWL are disposed in orthogonal directions, and MTJ elements are disposed corresponding to each intersection. Each MTJ element is provided with a spin direction such that the long-side of rectangle is set along the write word line WWL and that the short-side is set along the bit line BL, and along the long-side direction.

Each bit line BL is connected to each fixed layer of plural MTJ elements of the same row or same column, and each write word line WWL is disposed so as to face closely to each free layer of plural MTJ elements of the same column or same row.

Figure 4:
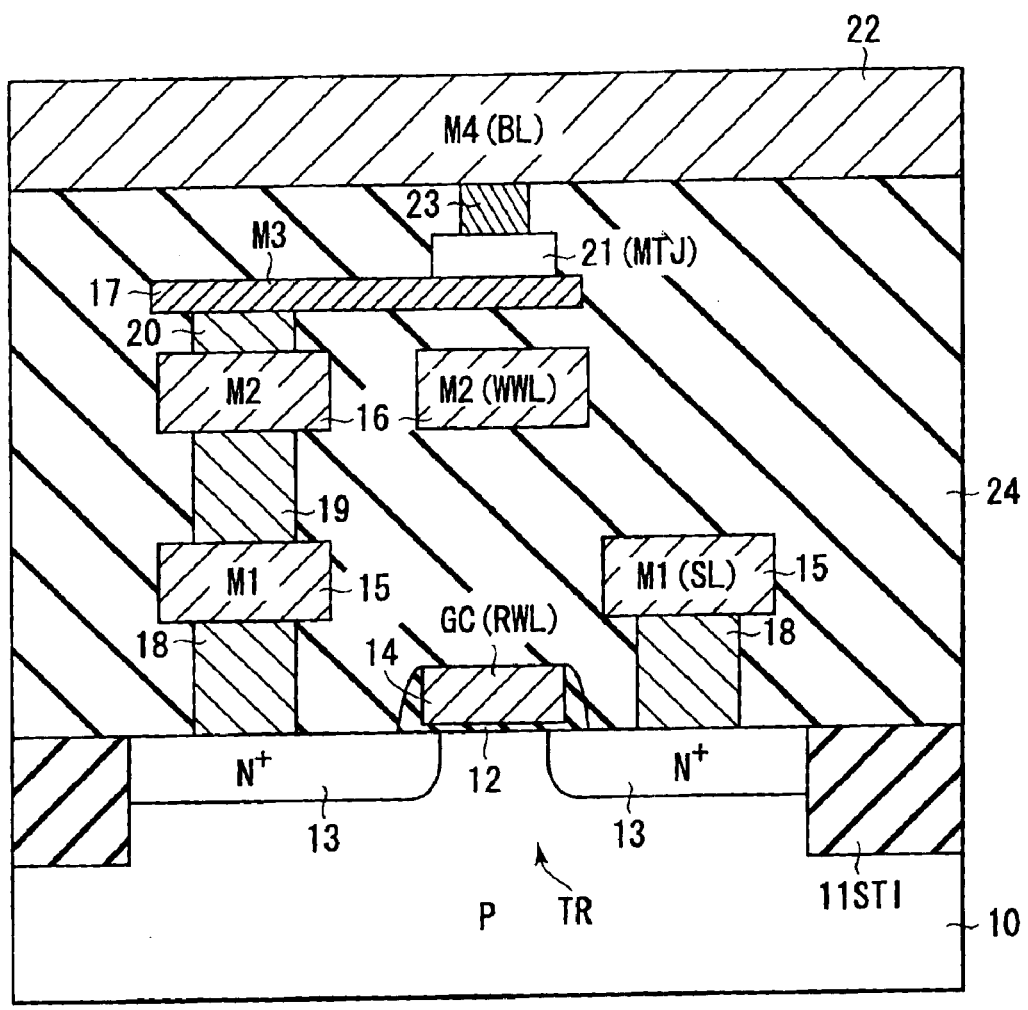
FIG. 4 is a sectional view schematically showing an example of a memory cell taken along line IV—IV in FIG. 3.
Figure 5:
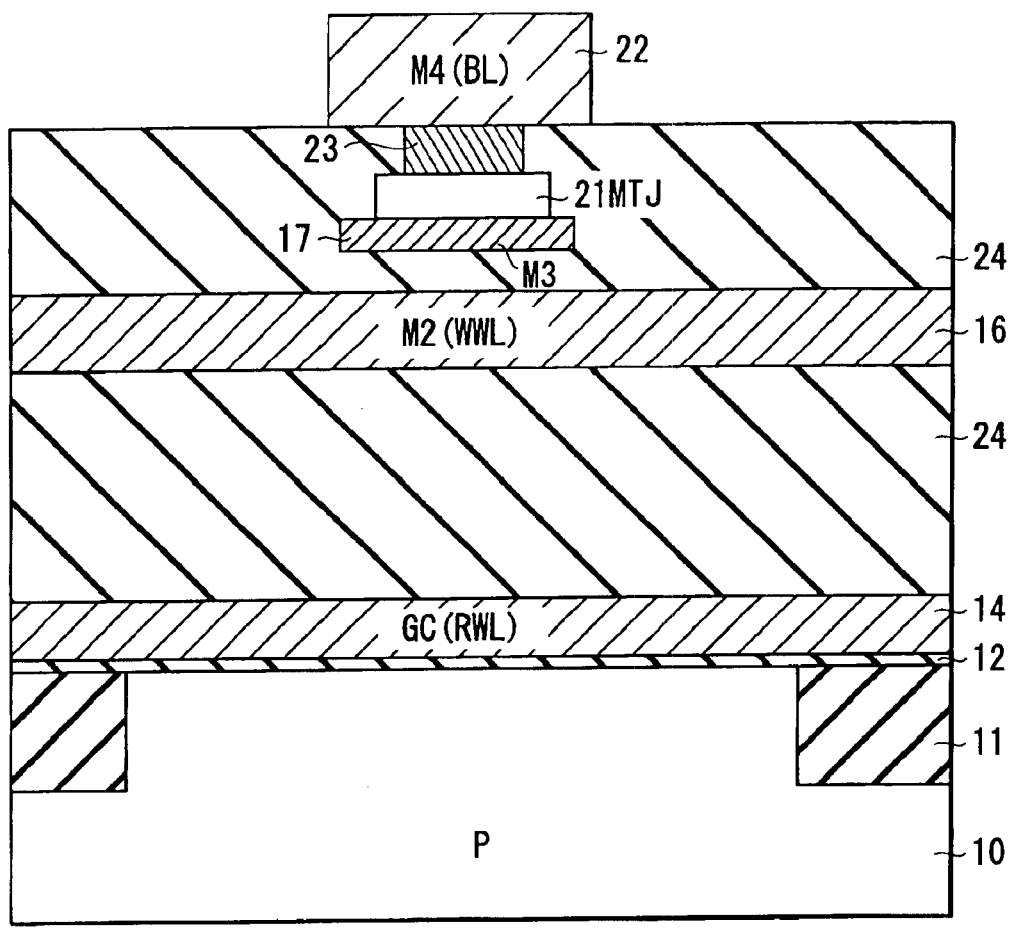
FIG. 5 is a sectional view schematically showing an example of a memory cell taken along line V—V in FIG. 3.

FIG. 4 is a sectional view of a memory cell taken along line IV—IV in FIG. 3, and FIG. 5 is a sectional view of a memory cell taken along line V—V in FIG. 3.

In FIGS. 4 and 5, reference numeral 10 is a semiconductor substrate made of, for example, a P-type Si substrate, 11 is a shallow-trench-type isolation region (STI), 12 is a gate oxide film, 13 is an $N^+$ impurity diffusion layer serving as a drain region or source region of NMOSFET TR for switching element, 14 is a gate electrode (GC) serving as a read word line RWL, 15, 16 and 17 are MTJ connection wirings composed of first metal wiring layer (M1), second metal wiring layer (M2), and third metal wiring layer (M3), respectively, 18 is a conductive contact plug for electrically connecting the first metal wiring layer 15 to the diffusion layer 13, 19 is a conductive contact plug for electrically connecting from the second metal wiring layer 16 to the first metal wiring layer 15, 20 is a conductive contact plug for electrically connecting from the third metal wiring layer 17 to the second metal wiring layer 16, 21 is an MTJ element, 22 is a fourth wiring layer (M4), 23 is a conductive contact plug for electrically connecting the fourth metal wiring layer 22 to the MTJ element 21, and 24 is an interlayer insulation film.

As the wiring in FIG. 4, meanwhile, BL denotes the bit line for writing/reading, WWL denotes the write word line, SL denotes the source line and RWL denotes the read word line. The source line (SL) is connected to the grounding potential.

Referring now to FIGS. 3 to 6, the principle of writing operation on the MTJ element will be explained.

Writing to the MTJ element is achieved by passing current in the write word lines WWL and bit lines (data select lines) BL and turning the spin direction of the MTJ element in parallel or anti-parallel direction by using the magnetic field generated by the current flowing in both wirings.

That is, when writing information into the MTJ element, current is passed in the bit line BL in a first direction or reverse second direction depending on the write data to generate a magnetic field Hx, and current flowing only in the first direction is passed in the write word line WWL to generate a magnetic field Hy, so that the information is written by using the combined magnetic field. At this time, when current flowing in the first direction is passed in the bit line BL, the spin direction of the MTJ element is parallel, or when current flowing in the second direction is passed in the bit line BL, the spin direction of the MTJ element is anti-parallel.

When reading out information from the MTJ element, the read word line RWL is activated, and only the switch element TR connected to the selected MTJ element is turned on to form a current route, and current is passed from the selected bit line BL to the grounding potential. As a result, since current depending on the resistance value flows only in the selected MTJ element, the information can be read out by detecting this current value.

Mechanism of varying the spin direction of the MTJ element will be briefly explained.

Figure 6:
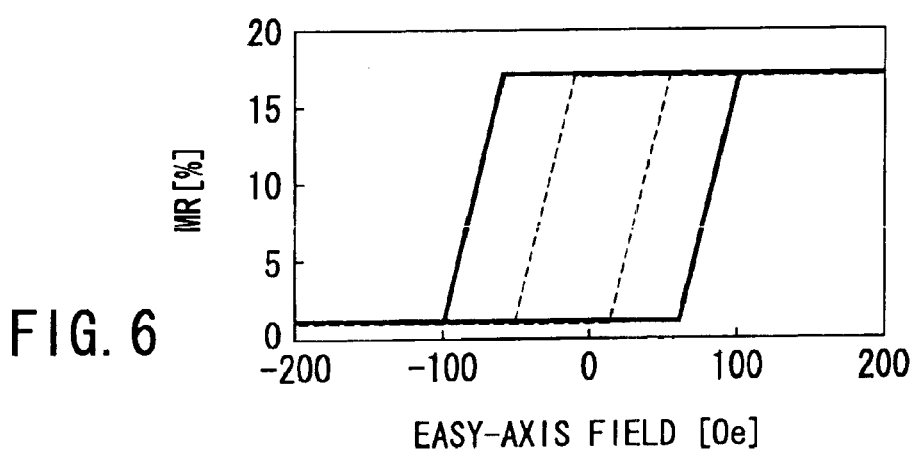
FIG. 6 is a characteristic diagram showing a TMR curve of the MTJ element.
Figure 7:
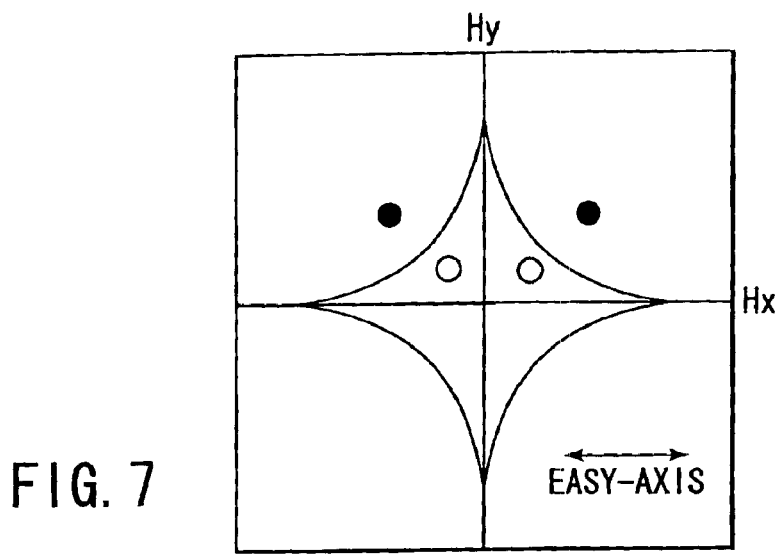
FIG. 7 is a characteristic diagram showing an asteroid curve of the MTJ element.

FIG. 6 shows the variation characteristic of the resistance value (TMR curve) by inversion of the magnetic field applied to the MTJ element. FIG. 7 shows an asteroid curve of the MTJ element.

As shown in the TMR curve in FIG. 6, when the magnetic field Hx is applied in the easy-axis direction of the MTJ element, the resistance value of the MTJ element is changed, for example, by about 17%. This change rate, that is, the ratio of the resistance value before and after change is called an MR ratio. The MR ratio varies with the property of the magnetic layer of the MTJ element. At the present, MTJ elements with MR ratio of about 50% are developed.

In the MTJ element, a combined magnetic field of the magnetic field Hx in the easy-axis direction and the magnetic field Hy in the hard-axis direction is applied. As indicated by the solid line and broken line in FIG. 6, depending on the magnitude of the magnetic field Hy in the hard-axis direction, the magnitude of the magnetic field Hx in the easy-axis direction necessary for varying the resistance value of the MTJ element is changed.

By making use of this phenomenon, of the memory cells in array layout, the data can be written only into the MTJ element disposed at the intersection of the selected write word line WWL and selected bit line BL. This operation is explained by referring to the asteroid curve in FIG. 7.

As shown in FIG. 7, when the magnitude of the combined magnetic field of the magnetic field Hx in the easy-axis direction and the magnetic field Hy in the hard-axis direction is outside of the asteroid curve, for example, at the black circle position, the spin direction of the magnetic layer of the MTJ element can be inverted.

To the contrary, when the magnitude of the combined magnetic field of the magnetic field Hx in the easy-axis direction and the magnetic field Hy in the hard-axis direction is inside of the asteroid curve, for example, at the white circle position, the spin direction of the magnetic layer of the MTJ element cannot be inverted.

Therefore, by varying the magnitude of the combined magnetic field of the magnetic field Hx in the easy-axis direction and the magnetic field Hy in the hard-axis direction and by changing the position of the magnitude of the combined magnetic field within the Hx-Hy plane, data writing to the MTJ element can be controlled.

First Embodiment

MRAM according to a first embodiment has an array of MTJ elements as shown in FIG. 3. That is, plural bit lines BL for writing/reading (first wiring) and plural write word lines WWL (second wiring) are disposed in orthogonal directions, and MTJ elements are disposed corresponding to each intersection.

Figure 8:
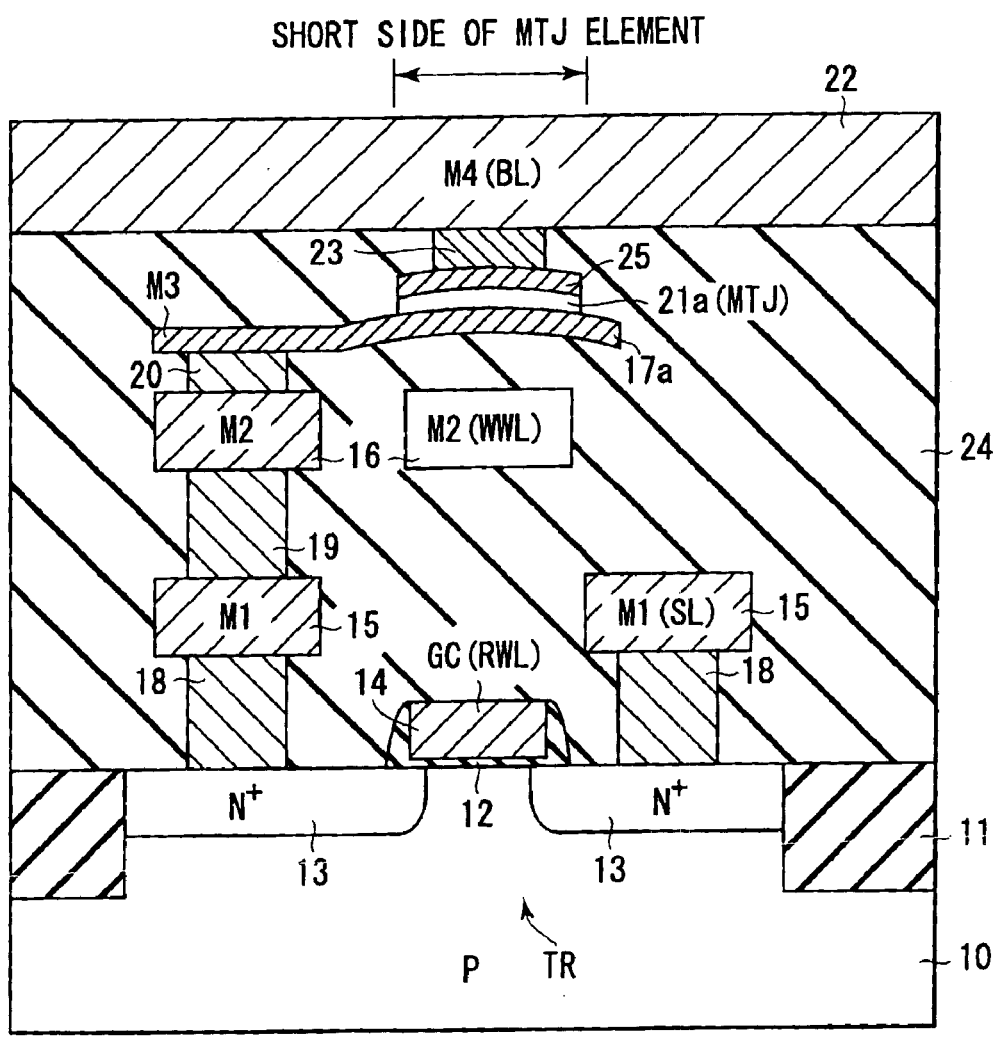
FIG. 8 is a sectional view of a memory cell in MRAM according to a first embodiment of the invention.
Figure 9:
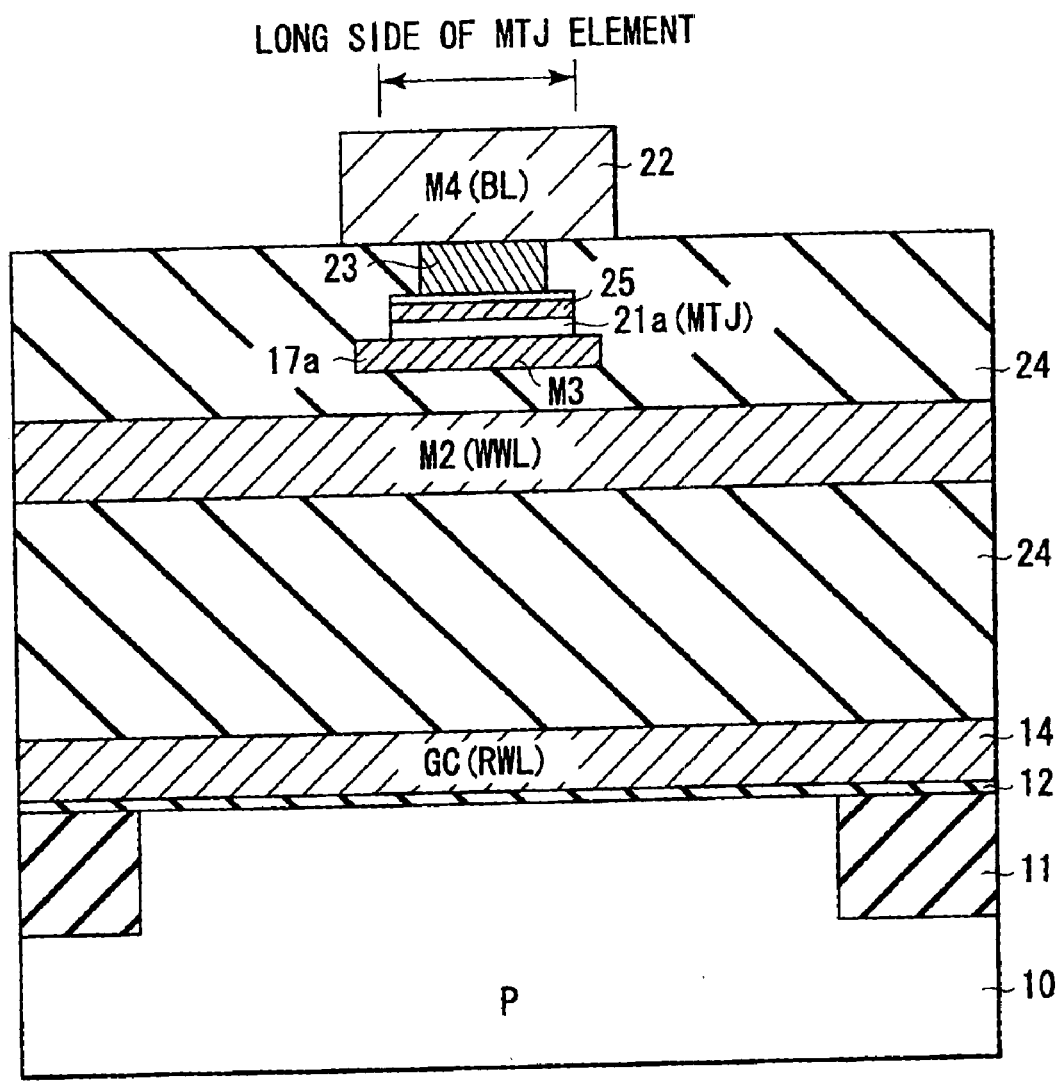
FIG. 9 is a sectional view, different from FIG. 8, of the memory cell in the MRAM according to the first embodiment.

FIGS. 8 and 9 are sectional views showing examples of a structure of the MTJ element and MOSFET for switch, giving attention to one memory cell in the MRAM according to the first embodiment of the invention. The section in FIG. 8 corresponds to the section in FIG. 4, and the section in FIG. 9 corresponds to the section in FIG. 5.

The structure shown in FIGS. 8 and 9 is only slightly different from the structure in FIGS. 4 and 5, and therefore parts corresponding to FIGS. 4 and 5 are identified with the same reference numerals and explanation is omitted, and only different points from FIGS. 4 and 5 are described below.

The MTJ element 21a used in the embodiment is similar to the MTJ element explained in FIG. 1 except that the central portion in the short-side direction around the long-side of rectangle or ellipse is swollen toward the direction of the bit line, that is, curved in a convex form upwardly. That is, the tunneling magneto-resistive effect is provided by a structure in which a tunnel barrier film 73 is sandwiched between a free layer 71 on the spin variable side and a fixed layer 72 on the spin fixed side. Thus, the easy-to-write axis or spin direction is provided such that the long-side is set along the write word line WWL, and that the short-side is set along the bit line BL.

A conductive hard mask 25 made of, for example, Ta is formed so as to cover the curved outer surface of this MTJ element 21a. The MTJ element 21a and bit line BL are electrically connected by the conductive contact plug 23 by way of the hard mask 25. An MTJ connection wiring 17a made of metal, such as Ta, is formed so as to contact with the curved inner surface of the MTJ element 21a. The interlayer insulating film 24 is interposed between the connection wiring 17a and the write word line WWL. The interlayer insulating film 24 projects toward the direction of the bit line BL in the portion facing the curved inner surface of the MTJ element 21a more than the other portion consecutive thereto.

In the MRAM of the first embodiment, the long-side direction of the MTJ element 21a, that is, the spin direction is orthogonal to the bit line BL, and the MTJ element 21a is warped so as to coincide substantially with the magnetic field curve generated from the write word line WWL. Therefore, the magnetic field intensities applied in the central portion and end portion in the width direction of the free layer 71 of the MTJ element 21a in the curved state, that is, the short-side direction, are equal to each other. As a result, the inverting magnetic field is decreased, the writing efficiency is enhanced, and the writing current is decreased. In this case, in order to enhance the magnetic field intensity applied to the end portion in the width direction of the free layer of the MTJ element 21a, preferably the length of the chord between the both leading ends of the short-side of the MTJ element 21a in the curved state should be wider than the width of the write word line WWL.

Figure 10:
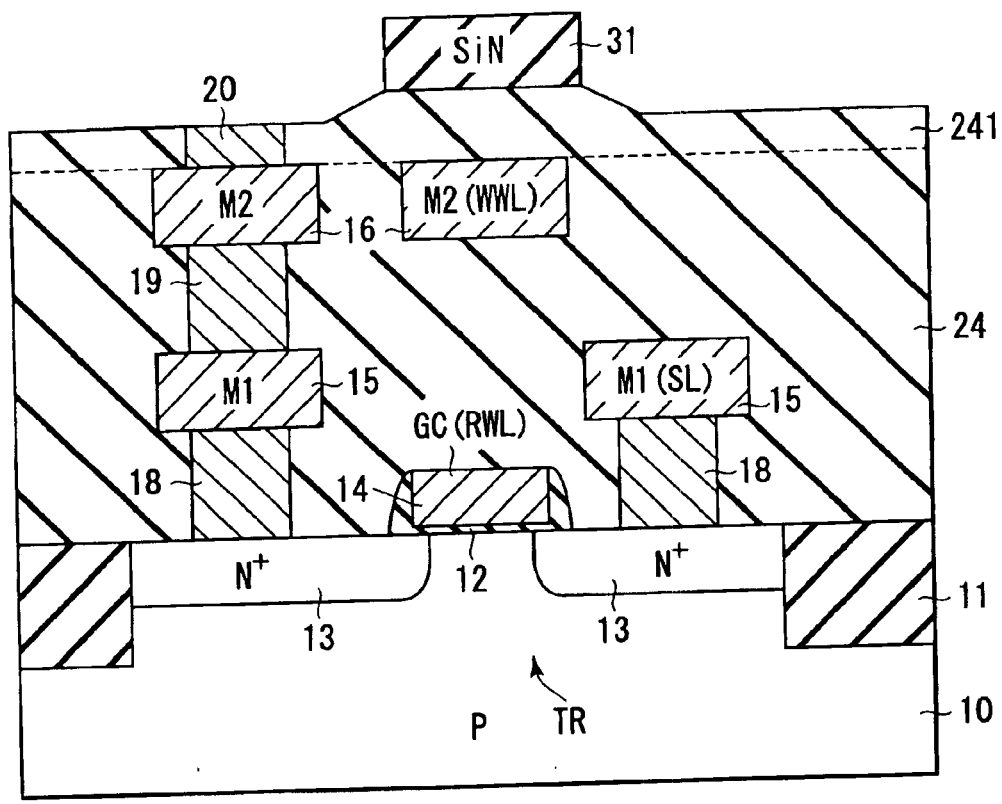
FIG. 10 is a sectional view showing a part of a process of forming MRAM having the structure shown in FIGS. 8 and 9.

FIG. 10 shows a structure in a section vertical to the write word line in an example of a process of forming the MRAM having the structure shown in FIGS. 8 and 9.

The interlayer insulating film 24 is composed of plural layers of insulating film, but only a part of an insulating film 241 is shown herein for the sake of simplicity of explanation.

First, the isolation region (STI) 11 is formed at a selected position of the surface layer of the P-type Si substrate 10. Next, the gate insulating film 12 of NMOSFET for switch, the gate electrode (GC) (read word line RWL) 14, and the drain region and source region 13 made of a $N^+$ diffusion layer are formed. The contact plugs 18 are formed on the drain region and source region 13, and the first metal wiring layers (M1) 15 are formed on the contact plugs 18. The contact plug 19 is formed on the first metal wiring layer 15, and the second metal wiring layer (M2) 16 of, for example, Cu wiring is formed on the contact plug 19. Further, the interlayer insulating film 241 of about 600 nm in thickness, and a silicon nitride (SiN) film 31 of about 300 nm in thickness are deposited.

By lithographic technique and reactive ion etching (RIE) technique, the SiN film 31 is left over in a desired pattern, and using the SiN film 31 as a mask, the interlayer insulating film 241 is processed by etching (milling) at an oblique angle.

At this time, in order to form the MTJ element 21a as repetitive pattern in a later process, the mutual space regions of the MTJ elements 21a are formed in grooves to form repetitive pattern. As a result, of the interlayer insulating film 241, the portion on which the MTJ element 21a is formed in a post-process is formed in an upward convex form as compared with other portions. That is, the thickness of the interlayer insulating film 241 of the MTJ element 21a forming portion is thicker than other portion.

After removing the pattern of the SiN film 31, as shown in FIG. 8, the contact plug 20 is formed on the second metal wiring layer 16, and further the third metal wiring layer (M3) 17a of, for example, Ta is deposited in a thickness of about 30 nm, and each layer forming the MTJ element 21a is deposited sequentially, and the hard mask 25 of, for example, Ta is formed in a thickness of about 150 nm. Herein, as the free layer of the MTJ element 21a, usually, NiFe is used, but other materials may be used, such as CoNiFe, CoFe, CoCr, or CoPt.

By lithographic technique and RIE technique, the hard mask 25 and MTJ element 21a are processed in a desired pattern, and further by lithographic technique and RIE technique, the third metal wiring layer 17a is processed in a desired pattern to form an MTJ connection wiring. In this case, parts of the third metal wiring layer 17a, that is, the convex portion at the upper side of the interlayer insulating film 241 mentioned above and the MTJ element 21a formed thereon are curved in a convex shape to the upper side.

Next, the contact plug 23 and fourth metal wiring layer (M4) 22 are formed to contact with the hard mask 25 at the upper side of the MTJ element 21a.

The curved surface may be formed also by making use of difference in the coefficient of thermal expansion due to difference in thickness ratio or material of the MTJ element 21a and hard mask 25.

Figure 11:
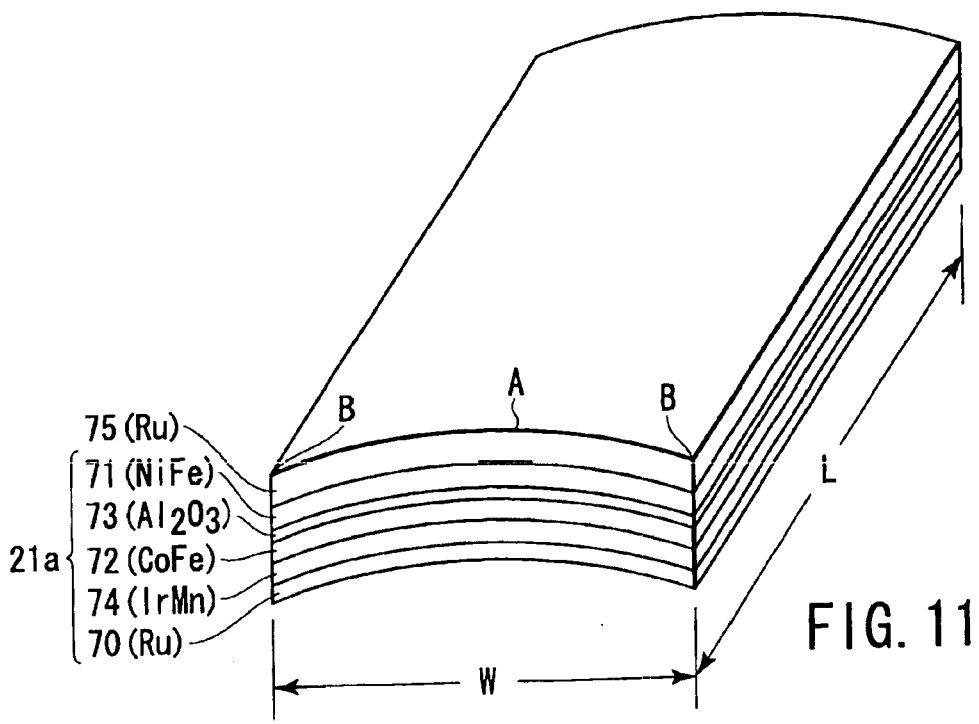
FIG. 11 is a perspective view of an MTJ element in the MRAM according to the first embodiment.

FIG. 11 is a detailed description of an example of a laminated structure of the MTJ element 21a shown in FIG. 8.

The MTJ element 21a is formed by laminating a buffer layer 70, the anti-ferromagnetic layer 74, the fixed layer 72, the tunnel barrier layer 73, the free layer 71, and a cap layer 75 sequentially on the third metal wiring layer (M3) 17a made of Ta about 30 nm in thickness as shown, for example, in FIG. 8, and further forming the hard mask 25 of, for example Ta about 150 nm in thickness in FIG. 8 thereon.

Herein, the buffer layer 70 is made of, for example, Rn, and is about 3 nm in thickness. The anti-ferromagnetic layer 74 is made of, for example, IrMn, and is about 10 nm in thickness. The fixed layer 72 is made of, for example, CoFe, and is about 3 nm in thickness. The tunnel barrier layer 73 is made of, for example, $Al_2O_3$, and is about 1.5 nm in thickness. The free layer 71 is made of, for example, NiFe, and is about 6 nm in thickness. The cap layer 75 is made of, for example, Ru, and is about 10 nm in thickness.

As an example of size of the MTJ element 21a, the width W in the short-side direction is 0.4 μm, the length L in the long-side direction is 1.2 μm, the upper side is curved in a convex form such that the both ends B may be lower by about 5 nm than the apex A in the middle of the short-side direction, and the radius of curvature at this time is about 4 μm.

Second Embodiment

MRAM according to a second embodiment has an array of MTJ elements as shown previously in FIG. 3, and plural bit lines BL for writing/reading (first wiring) and plural write word lines WWL (second wiring) are disposed in orthogonal directions, and MTJ elements 21b are disposed corresponding to each intersection.

Figure 12:
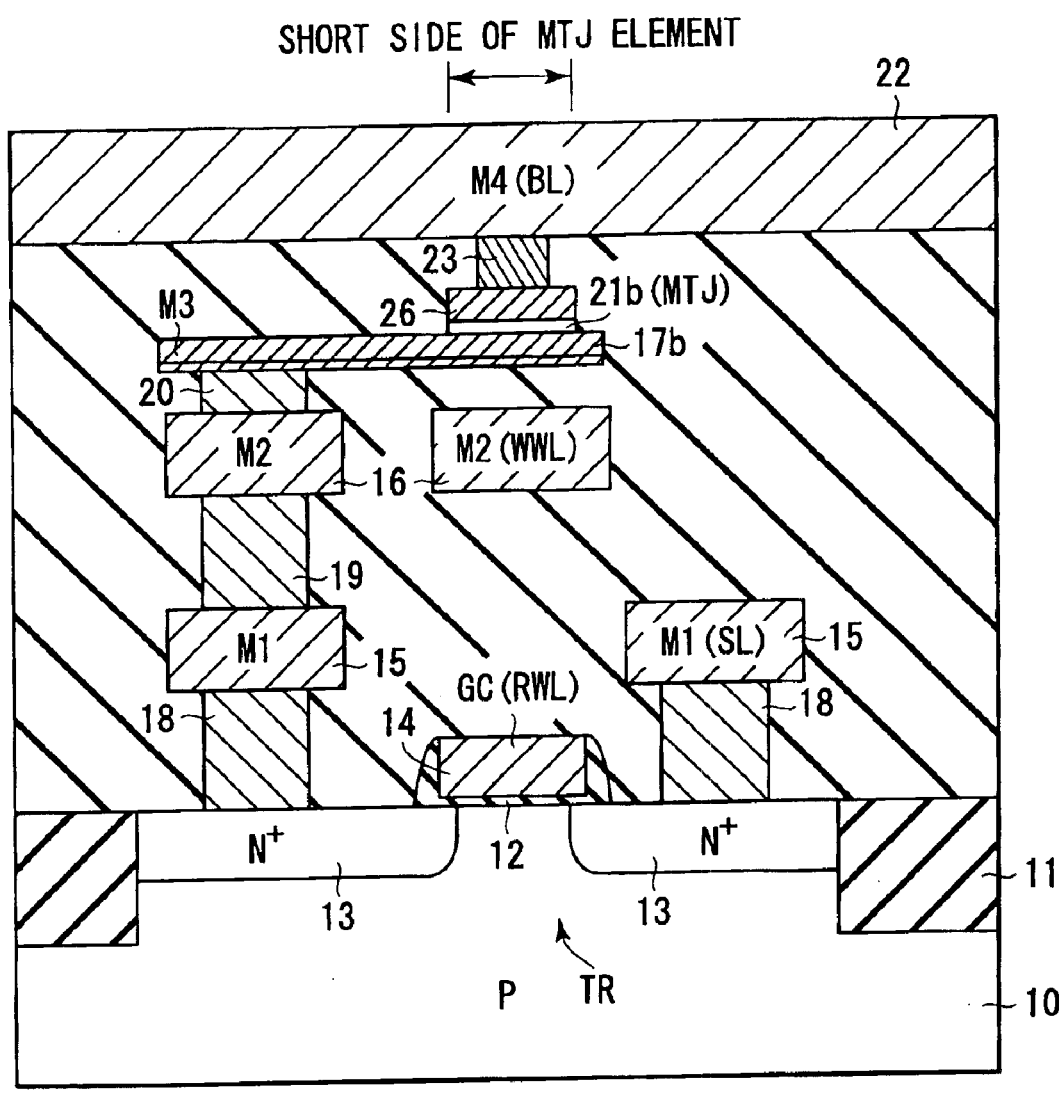
FIG. 12 is a sectional view of a memory cell in MRAM according to a second embodiment of the invention.
Figure 13:
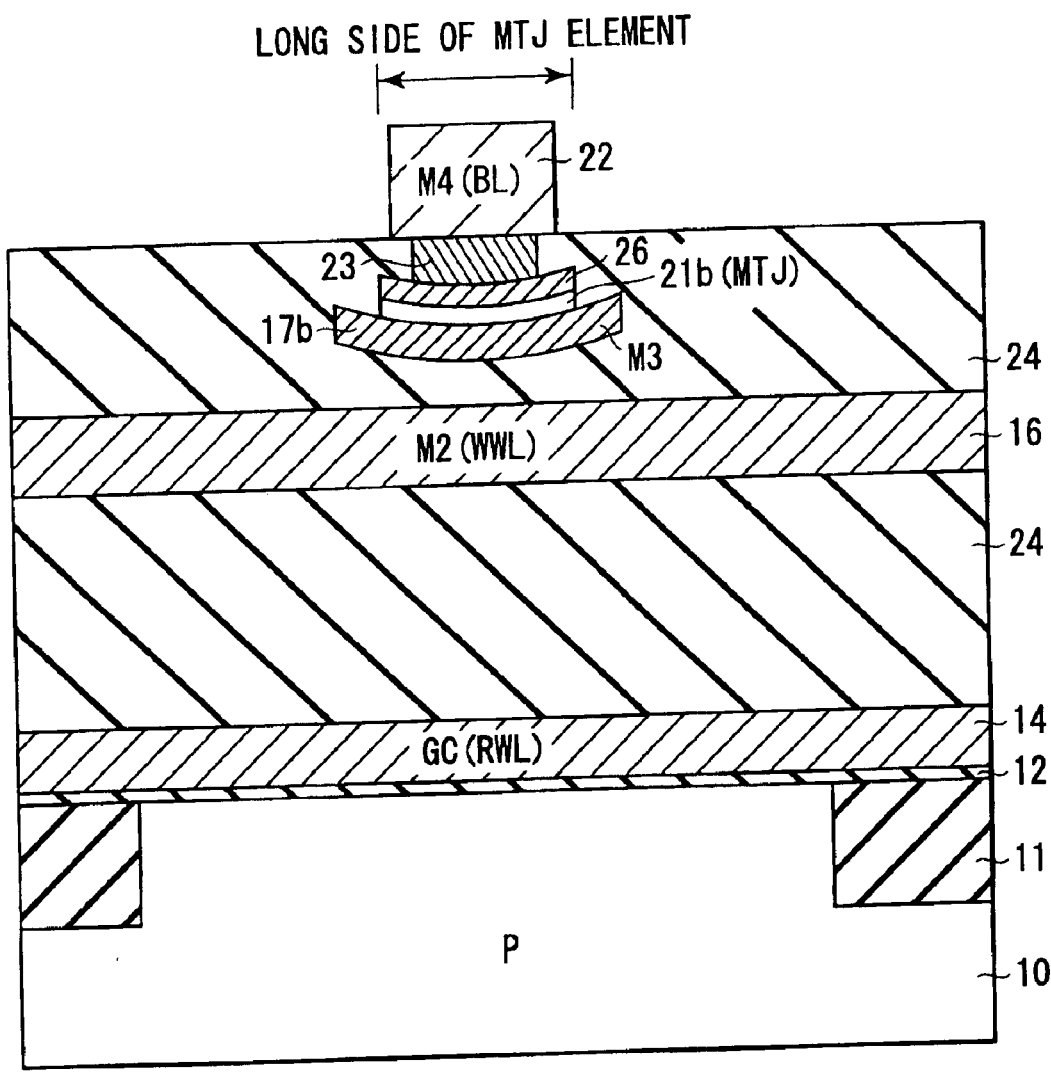
FIG. 13 is a sectional view, different from FIG. 12, of the memory cell in the MRAM according to the second embodiment.

FIGS. 12 and 13 are sectional views showing examples of a structure of the MTJ element and MOSFET for switch, giving attention to one memory cell in the MRAM according to the second embodiment of the invention. The section in FIG. 12 corresponds to the section in FIG. 4, and the section in FIG. 13 corresponds to the section in FIG. 5.

The structure shown in FIGS. 12 and 13 is similar to the structure in FIGS. 8 and 9, except that only the curved state of the MTJ element 21b is different.

That is, in the MTJ element 21b used in the second embodiment, the central portion in the long-side direction around the short-side of rectangle or ellipse is swollen toward the direction of the write word line WWL, that is, curved downward in a convex form. That is, as shown in FIG. 1, the tunneling magneto-resistive effect is provided by a structure in which the tunnel barrier film 73 is sandwiched between the free layer 71 on the spin variable side and the fixed layer 72 on the spin fixed side. Thus, the easy-to-write axis is provided such that the long-side is set along the write word line WWL, and that the short-side is set along the bit line BL.

A conductive hard mask 26 made of, for example, Ta is formed so as to cover the curved inner surface of this MTJ element 21b. The MTJ element 21b and bit line BL are electrically connected by the conductive contact plug 23 by way of the hard mask 26. An MTJ connection wiring 17b made of metal, such as Ta, is formed so as to contact with the curved outer surface of the MTJ element 21b. A part of the interlayer insulating film 24 is interposed between the connection wiring 17b and the write word line WWL. This part of the interlayer insulating film 24 is dented toward the direction of the write word line WWL in the portion facing inside and outside of the curved surface of the MTJ element 21b more than the other portion consecutive thereto. In other words, the film thickness of the interlayer insulating film 24 in the portion on which the MTJ element 21b is formed is thinner than the other portion.

In the MRAM of the second embodiment, the long-side direction of the MTJ element 21b, that is, the spin direction is orthogonal to the bit line BL, and the MTJ element 21b is warped so as to coincide nearly with the magnetic field curve generated from the bit line BL. Therefore, the magnetic field intensities applied in the central portion and end portion in the longitudinal direction of the free layer of the MTJ element 21b in the curved state, that is, the long-side direction, are equal to each other. As a result, the inverting magnetic field is decreased, the writing efficiency is enhanced, and the writing current is decreased. In this case, in order to enhance the magnetic field intensity applied to the end portion in the longitudinal direction of the free layer of the MTJ element 21b, preferably the length of the chord between the both leading ends of the long-side of the MTJ element 21b in the curved state should be wider than the width of the bit line BL.

Figure 14:
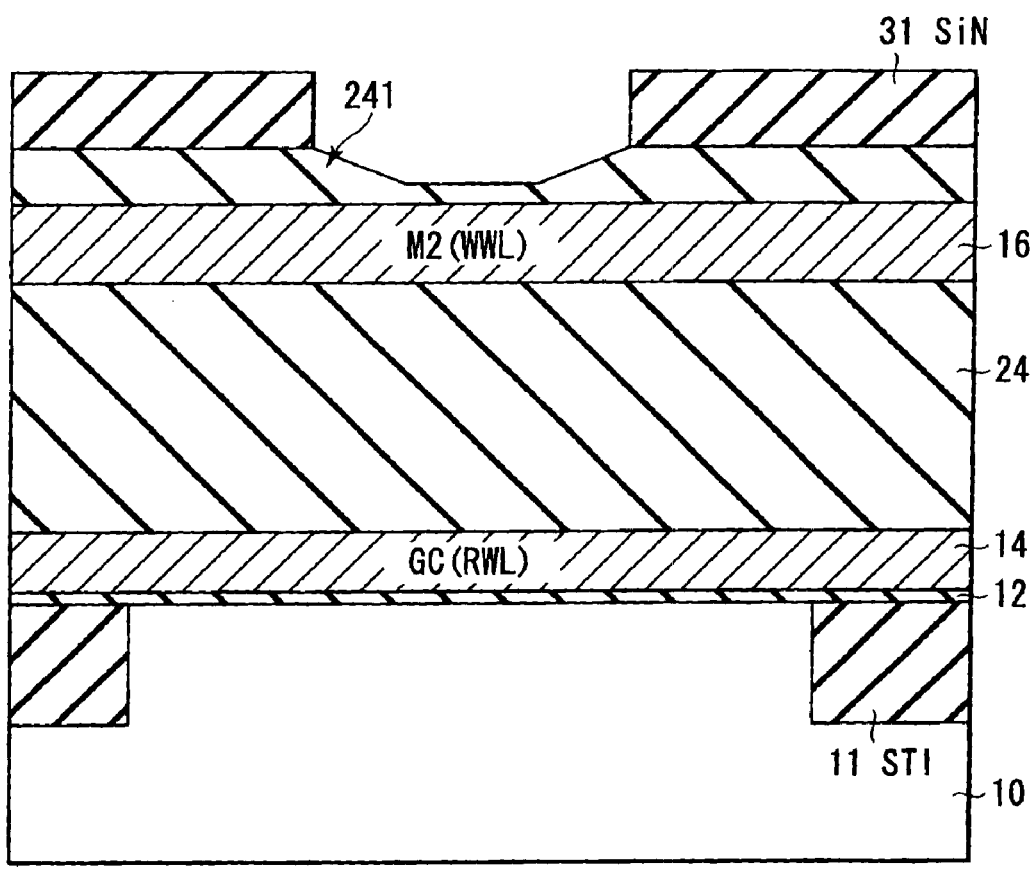
FIG. 14 is a sectional view showing a part of a process of forming MRAM having the structure shown in FIGS. 12 and 13.

FIG. 14 is a sectional view showing a structure in a section vertical to the bit line in an example of a process of forming the MTJ element having the structure shown in FIGS. 12 and 13. The interlayer insulating film 24 is composed of plural layers of insulating film, but only a part of an insulating film 241 is shown herein for the sake of simplicity of explanation.

First, the isolation region (STI) 11 is formed at a selected position of the surface layer of the P-type Si substrate 10. Next, the gate insulating film 12 of NMOSFET for switch, the gate electrode (GC) (read word line RWL) 14, and the drain region and source region 13 made of a $N^+$ diffusion layer are formed. The contact plugs 18 are formed on the drain region and source region 13, and the first metal wiring layers (M1) 15 are formed on the contact plugs 18. The contact plug 19 is formed on the first metal wiring layer 15, and the second metal wiring layer (M2) 16 of, for example, Cu wiring is formed, and also the interlayer insulating film 241 of about 600 nm in thickness, and a silicon nitride (SiN) film 31 of about 300 nm in thickness are deposited.

By lithographic technique and RIE technique, the SiN film 31 is formed in a desired pattern, and using the SiN film 31 as a mask, the interlayer insulating film 241 is processed by etching (milling) at an oblique angle. At this time, in order to form the MTJ element 21b as repetitive pattern in a post-process, the repetitive pattern is formed such that the region intended to dispose the MTJ elements 21b is formed in grooves.

After removing the SiN film 31, as shown in FIG. 12, the contact plug 20 is formed on the second metal wiring layer 16, and further the third metal wiring layer (M3) 17a of, for example, Ta is deposited in a thickness of about 30 nm, and each layer forming the MTJ element 21b is deposited sequentially, and the hard mask 26 of, for example, Ta is formed in a thickness of about 150 nm. Herein, as the free layer of the MTJ element 21b, usually, NiFe is used, but other materials may be used, such as CoNiFe, CoFe, CoCr, or CoPt.

By lithographic technique and RIE technique, the hard mask 26 and MTJ element 21b are processed in a desired pattern, and further by lithographic technique and RIE technique, so that the third metal wiring layer 17b is processed in a desired pattern to form an MTJ connection wiring.

Next, the contact plug 23 and fourth metal wiring layer (M4) 22 are formed to contact with the hard mask 26 at the upper side of the MTJ element 21b.

The curved surface may be formed also by making use of difference in the coefficient of thermal expansion due to difference in thickness ratio or material of the MTJ element 21b and hard mask 26.

In the foregoing embodiments, in order to realize large capacity and high density integlation, one cell array unit may be composed of memory cell array of plural MTJ elements disposed in matrix, a plurality of write word lines WWL, and a plurality of bit lines BL, and plural cell array units may be stacked up on a semiconductor substrate to compose a cell array laminated structure.

The invention may be easily applied in a multi-layer structure of recording layers of MTJ elements in each embodiment.

The MRAM according to the first and second embodiments may be applied in various examples. Some of the applicable examples are explained below.

APPLICABLE EXAMPLE 1

Figure 15:
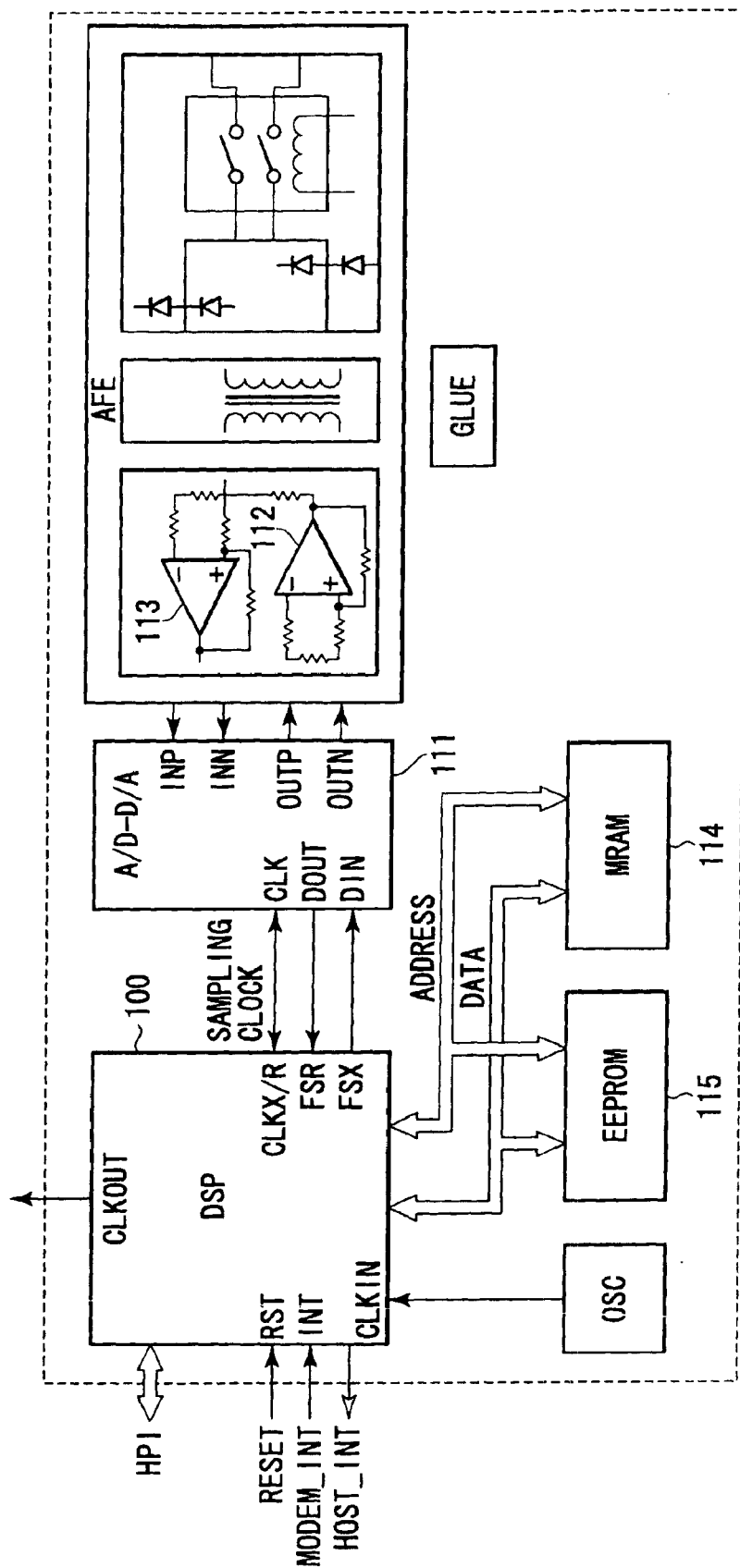
FIG. 15 is a block circuit diagram of a DSL data path portion of a digital subscriber line modem as one of application examples of MRAM.

As one of applicable examples of the MRAM, FIG. 15 shows a digital subscriber line (DSL) data path portion of a digital subscriber line (DSL) modem. This modem includes a programmable digital signal processor (DSP) 100, an analog-to-digital converter (A/D) and digital-to-analog converter (D/A) 111, a transmission driver 112, and a receiver amplifier 113. In FIG. 15, the band pass filter is omitted, and an MRAM 114 and an EEPROM 115 are shown instead as an optional memory of various types capable of holding a line code program.

In this example, as the memory for holding the line code program, two memories MRAM and EEPROM are used, but the EEPROM may be replaced by the MRAM, that is, without using two memories, only the MRAM may be used.

APPLICABLE EXAMPLE 2

Figure 16:
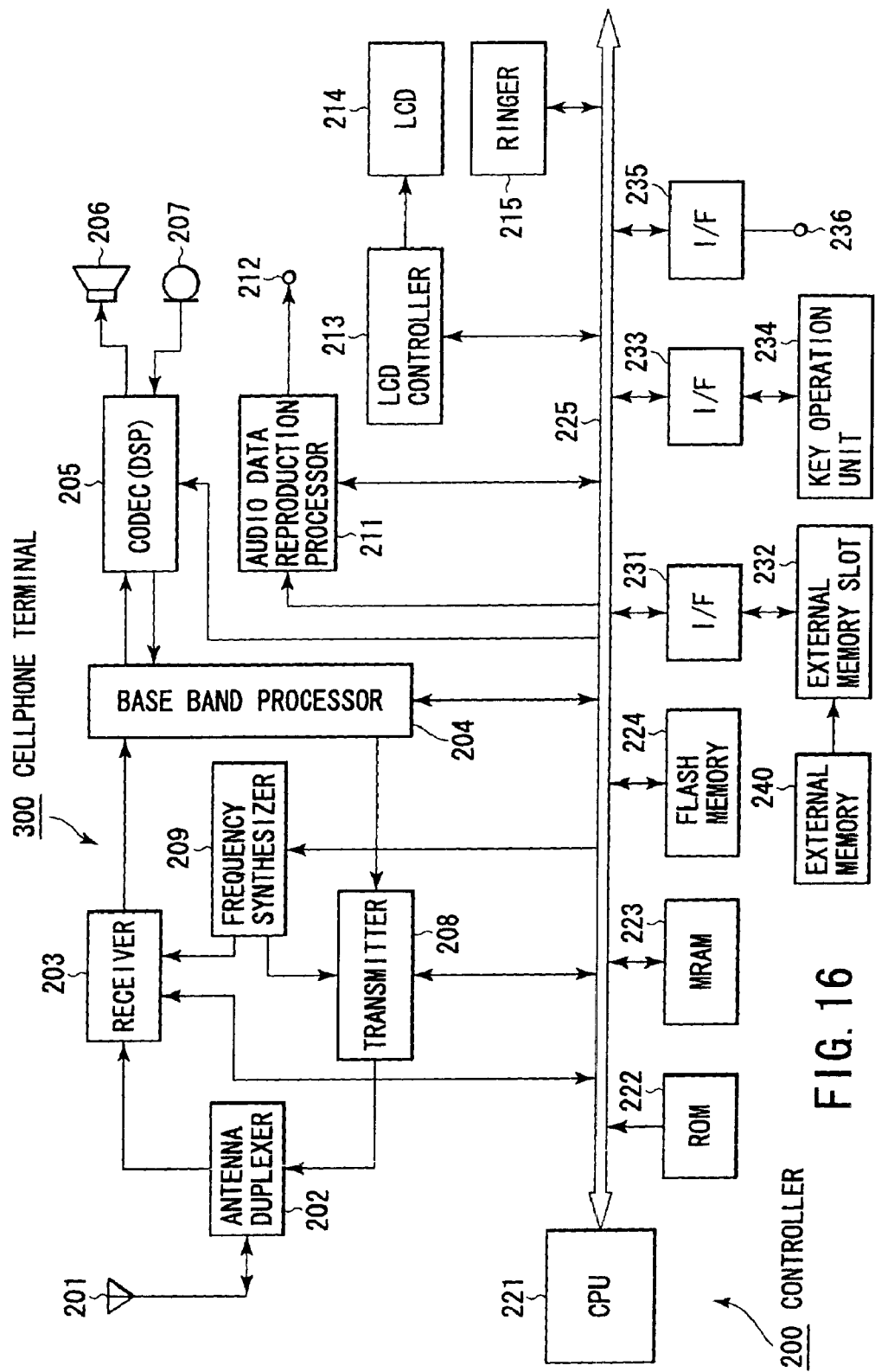
FIG. 16 is a block circuit diagram of a circuit portion for realizing communication function in a cellphone terminal as another application example of MRAM.

As another applicable example of the MRAM, FIG. 16 shows a portion for realizing communication function in a cellphone terminal 300. As shown in FIG. 16, the portion for realizing the communication function comprises a transmission and reception antenna 201, an antenna duplexer 202, a receiver 203, a base band processor 204, a digital signal processor (DSP) 205 used as audio codec, a loudspeaker 206, a microphone 207, a transmitter 208, and a frequency synthesizer 209.

Also as shown in FIG. 16, the cellphone terminal 300 has a controller 200 for controlling the parts of the cellphone terminal. The controller 200 is a microcomputer composed by connecting a CPU 221, a ROM 222, an MRAM 223, and a flash memory 224 by way of a CPU bus 225.

Herein, the ROM 222 preliminarily stores programs to be executed in the CPU 221, and necessary data such as display font. The MRAM 223 is mainly used as a working region, and specifically it is used when storing necessary data in the midst of calculation as required during program execution by the CPU 221, or when temporarily storing data to be used in communications between the controller 200 and other parts. The flash memory 224 stores the immediate preceding setting conditions or the like even if the power source of the cellphone terminal 300 is turned off, or stores the setting parameters when using by setting in the same conditions when the power source is turned on again. That is, the flash memory 224 is a nonvolatile memory holding the stored data even if the power source of the cellphone terminal is turned off.

In this example, the ROM 222, MRAM 223, and flash memory 224 are used, but the flash memory 224 may be replaced by the MRAM, or the ROM 222 may be also replaced by the MRAM.

In FIG. 16, reference numeral 211 is an audio data reproduction processor, 212 is an external terminal connected to the audio data reproduction processor 211, 213 is an LCD controller, 214 is an LCD connected to the LCD controller 213, 215 is a ringer, 231 is an interface (I/F) provided between a CPU bus 225 and an external memory slot 232, 233 is an interface (I/F) provided between the CPU bus 225 and a key operation unit 234, 235 is an interface (I/F) provided between the CPU bus 225 and an external terminal 236, and an external memory 240 is inserted into the external memory slot 232.

APPLICABLE EXAMPLE 3

FIGS. 17 to 21 show an example in which the MRAM is applied in a card holding media contents such as smart media (MRAM card).

Figure 17:
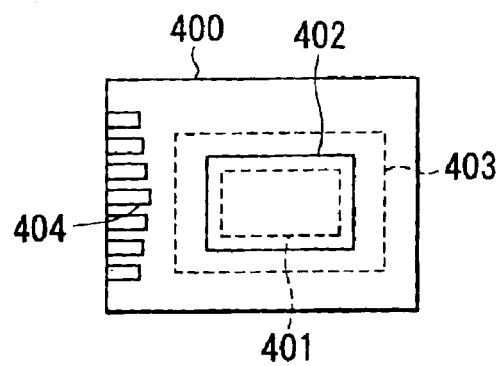
FIG. 17 is a top view showing an example in which the MRAM is applied to an MRAM card.

In a top view in FIG. 17, reference numeral 400 is an MRAM card main body, 401 is an MRAM chip, 402 is an opening, 403 is a shutter, and 404 denotes plural external terminals. The MRAM chip 401 is contained in the MRAM card main body 400, and is exposed to outside through the opening 402. While carrying the MRAM card, the MRAM chip 401 is covered with the shutter 403. The shutter 403 is made of a material having an effect of shielding an external magnetic field, such as ceramic material. When transferring the data, the shutter 403 is released, and the MRAM chip 401 is exposed. The external terminals 404 are for taking out the contents data stored in the MRAM card to outside.

Figure 18:
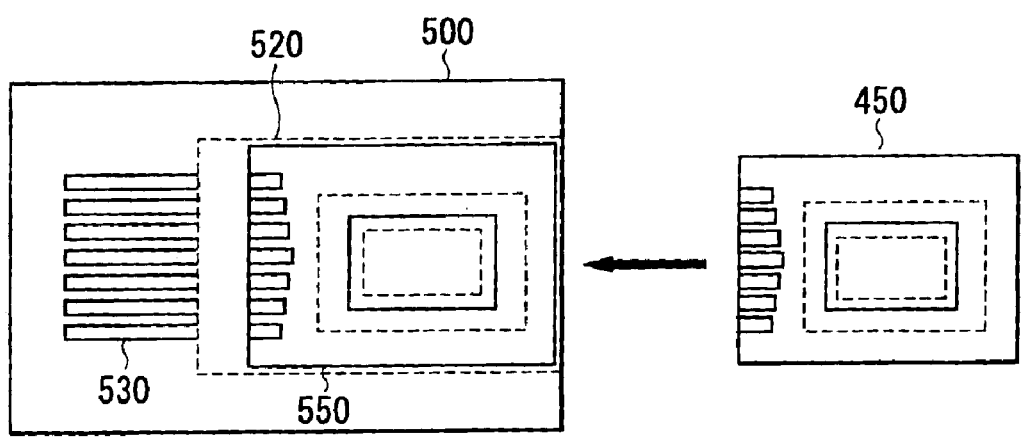
FIG. 18 is a top view of a transfer device of card insert type for transferring data on the MRAM card in FIG. 17.
Figure 19:
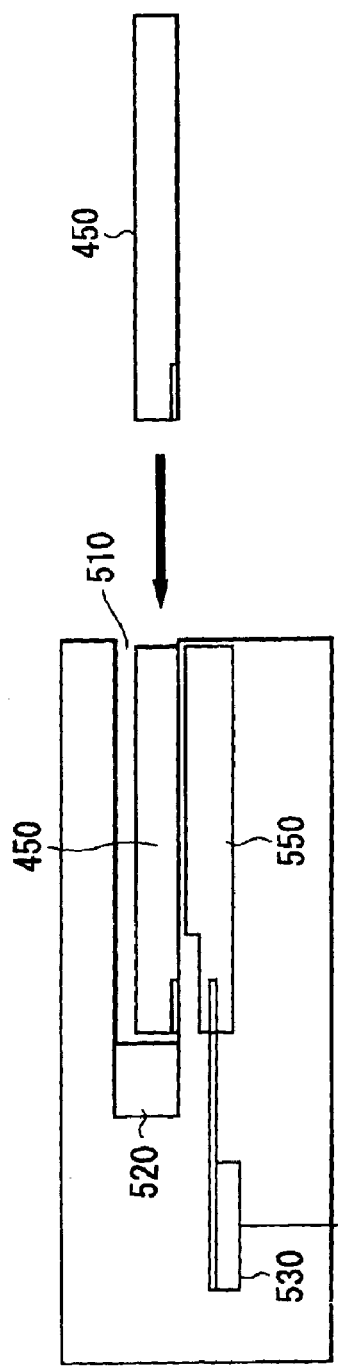
FIG. 19 is a side view of the transfer device in FIG. 18.

FIGS. 18 and 19 are a top view and a side view of a transfer device of card insert type for transferring data on the MRAM card. A second MRAM card 450 used by an end user is inserted from a slit 510 in a transfer device 500, and pushed in until stopped by a stopper 520. The stopper 520 is also used as a member for positioning the first MRAM card 550 and second MRAM card 450. With the second MRAM card 450 disposed at specified position, the data stored in the first MRAM card 550 is transferred into the second MRAM card 450.

Figure 20:
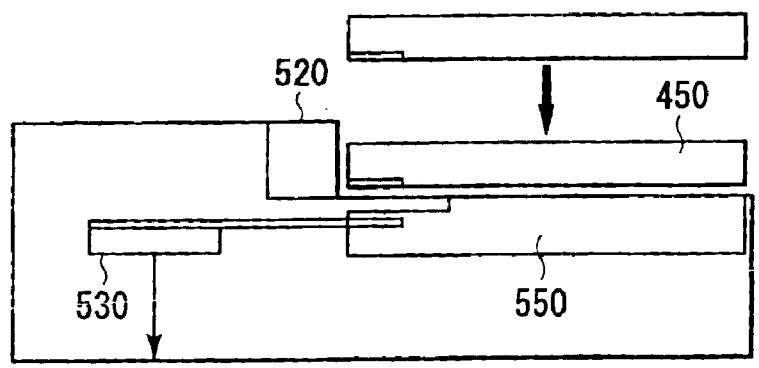
FIG. 20 is a side view of a transfer device of fit-in type for transferring data on the MRAM card in FIG. 17.

FIG. 20 is a side view of a transfer device of fit-in type. As indicated by arrow in the drawing, in this type, aiming at the stopper 520, the second MRAM card 450 is fitted on the first MRAM card 550. The transfer method is same as that in the cart insert type, and explanation is omitted.

Figure 21:
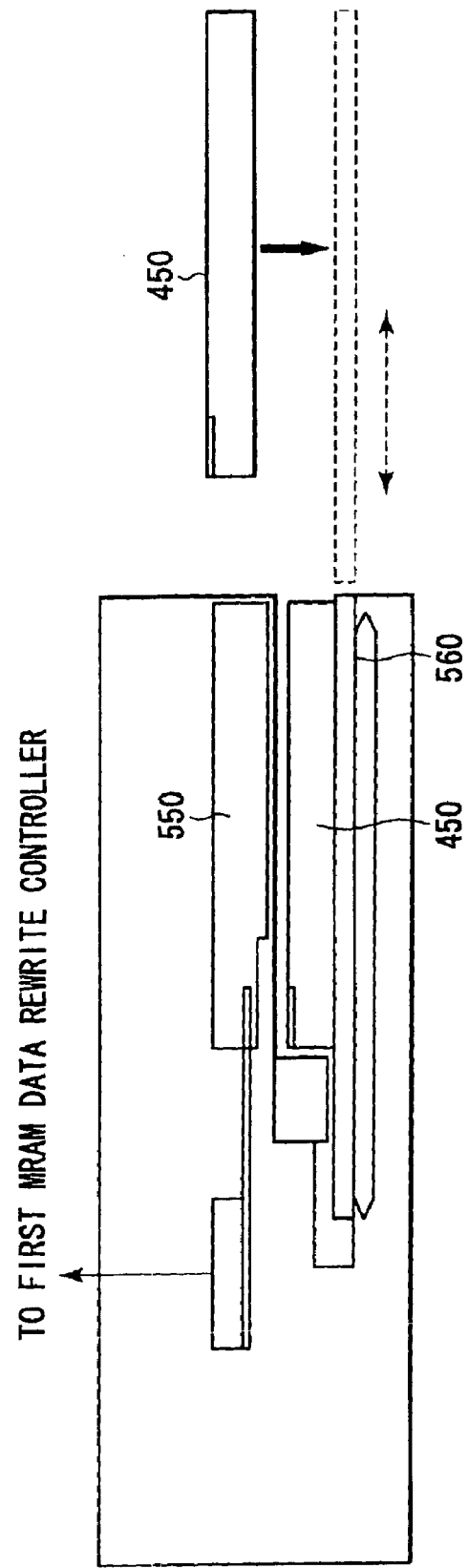
FIG. 21 is a side view of a transfer device of slide type for transferring data on the MRAM card in FIG. 17.

FIG. 21 is a side view of a transfer device of slide type. In the same manner as in the CD-ROM drive or DVD drive, a receiving tray slide 560 is provided in the transfer device 500, and this receiving tray slide 560 slides in the horizontal direction as indicated by arrow in the drawing. When the receiving tray slide 560 moves to the state indicated by the broken line in the drawing, the second MRAM card 450 is put on the receiving tray slide 560. Then, the receiving tray slide 560 conveys the second MRAM card 450 into the inside of the transfer device 500. The second MRAM card 450 is conveyed until its leading end hits against the stopper 520, and the data is transferred, same as in the card insert type, and explanation is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    at least one first wiring and at least one second wiring disposed so as to intersect each other;
    at least one magnetic tunnel junction element having the tunneling magneto-resistive effect and disposed at the intersection of the first and second wirings, said at least one magnetic tunnel junction element having a structure in which a non-magnetic layer is sandwiched between a fixed layer and a free layer both made of a magnetic film, having a long-side and a short-side of a rectangle, being provided with a spin direction such that the long-side of rectangle is set along the second wiring and that the short-side thereof is set along the first wiring, and along the long-side direction, and having an upper surface which is upwardly convex in the central portion as viewed in the short-side direction, with the long axis as a center of convexity, and a lower surface which is downwardly concave in the central portion as viewed in the short-side direction, with the long axis as a center of concavity;
    a conductive hard mask formed to cover the upper surface of the magnetic tunnel junction element;
    conductive contact plugs for electrically connecting the hard mask and the first wiring;
    a connection wiring to be electrically connected to the lower surface of the magnetic tunnel junction element; and
    an interlayer insulating film provided to be interposed between the connection wiring and the second wiring.

2. The magnetic random access memory according to claim 1, wherein the material of the hard mask is tantalum.

3. The magnetic random access memory according to claim 1, wherein the interlayer insulating film is thicker in the portion facing the lower surface of the magnetic tunnel junction element than in the other portion consecutive thereto.

4. The magnetic random access memory according to claim 1, wherein the width of the second wiring is narrower than the length of the chord between both leading ends of the short-side in the curved state of the magnetic tunnel junction element.

5. The magnetic random access memory according to claim 1, wherein said at least one first wiring and one second wiring include, respectively, a plurality of first wirings and a plurality of second wirings, said at least one magnetic tunnel junction element includes a plurality of magnetic tunnel junction elements disposed in an array form at each intersection of said plurality of first wirings and second wirings, said plurality of first wirings are bit lines for writing/reading, and said plurality of second wirings are write word lines.

6. The magnetic random access memory according to claim 1, further comprising:
    a switching transistor for reading, electrically connected to the magnetic tunnel junction element via the connecting wiring.

7. A magnetic random access memory comprising:
    at least one first wiring and at least one second wiring disposed so as to intersect each other;
    at least one magnetic tunnel junction element having the tunneling magneto-resistive effect and disposed at the intersection of the first and second wirings, said at least one magnetic tunnel junction element having a structure in which a non-magnetic layer is sandwiched between a fixed layer and a free layer both made of a magnetic film, having a long-side and a short-side of a rectangle, being provided with a spin direction such that the long-side of rectangle is set along the second wiring and that the short-side thereof is set along the first wiring, and along the long-side direction, and having an upper surface which is downwardly concave in the central portion as viewed in the long-side direction, with the short axis as a center of concavity, and a lower surface which is upwardly convex in the central portion as viewed in the long-side direction, with the short axis as a center of convexity;
    a conductive hard mask formed to cover the upper surface of the magnetic tunnel junction element;
    conductive contact plugs for electrically connecting the hard mask and the first wiring;
    a connection wiring to be electrically connected to the lower surface of the magnetic tunnel junction element; and
    an interlayer insulating film provided to be interposed between the connection wiring and the second wiring.

8. The magnetic random access memory according to claim 7, wherein the material of the hard mask is tantalum.

9. The magnetic random access memory according to claim 7, wherein the interlayer insulating film is thinner in the portion facing the lower surface of the magnetic tunnel junction element than in the other portion consecutive thereto.

10. The magnetic random access memory according to claim 7, wherein the width of the first wiring is wider than the length of the chord between both leading ends of the long-side in the curved state of the magnetic tunnel junction element.

11. The magnetic random access memory according to claim 7, wherein said at least one first wiring and one second wiring include, respectively, a plurality of first wirings and a plurality of wirings, said at least one magnetic tunnel junction element includes a plurality of magnetic tunnel junction elements disposed in an array form at each intersection of said plurality of first wirings and second wirings, said plurality of first wirings are bit lines for writing/reading, and said plurality of second wirings are write word lines.

12. The magnetic random access memory according to claim 7, further comprising:
    a switching transistor for reading, electrically connected to the magnetic tunnel junction element via the connecting wiring.

* * * * *